United States Patent
Hato et al.

(10) Patent No.: US 10,113,695 B2
(45) Date of Patent: Oct. 30, 2018

(54) LIQUID NITROGEN COOLING SENSOR DEVICE CONTAINER AND LIQUID NITROGEN COOLING SENSOR DEVICE

(71) Applicants: JAPAN OIL, GAS AND METALS NATIONAL CORPORATION, Tokyo (JP); INTERNATIONAL SUPERCONDUCTIVITY TECHNOLOGY CENTER, Kawasaki-shi, Kanagawa (JP)

(72) Inventors: Tsunehiro Hato, Kawasaki (JP); Keiichi Tanabe, Kawasaki (JP)

(73) Assignee: JAPAN OIL, GAS AND METALS NATIONAL CORPORATION, Tokyo (JP)

(*) Notice: Subject to any disclaimer, the term of this patent is extended or adjusted under 35 U.S.C. 154(b) by 139 days.

(21) Appl. No.: 14/367,179

(22) PCT Filed: Nov. 5, 2012

(86) PCT No.: PCT/JP2012/078654
§ 371 (c)(1),
(2) Date: Jun. 19, 2014

(87) PCT Pub. No.: WO2013/094325
PCT Pub. Date: Jun. 27, 2013

(65) Prior Publication Data
US 2014/0345298 A1    Nov. 27, 2014

(30) Foreign Application Priority Data

Dec. 20, 2011    (JP) .................. 2011-278556

(51) Int. Cl.
*F17C 1/00*     (2006.01)
*F17C 3/08*     (2006.01)
*G01R 33/035*   (2006.01)

(52) U.S. Cl.
CPC ........... *F17C 3/085* (2013.01); *G01R 33/035* (2013.01)

(58) Field of Classification Search
CPC ................. F17C 3/085; F17C 2203/01; F17C 2203/014–2203/018; F17C 2205/0153; F17C 2205/0196; G01R 33/035
See application file for complete search history.

(56) References Cited

U.S. PATENT DOCUMENTS 5,065,087 A    11/1991   Kita et al.
5,126,655 A    6/1992    Kita et al.
(Continued)

FOREIGN PATENT DOCUMENTS

DE    102008014003 A1    9/2009
JP    60-123912 A        7/1985
(Continued)

OTHER PUBLICATIONS

DE102008014003A1 Translation.*
(Continued)

*Primary Examiner* — Brian King
(74) *Attorney, Agent, or Firm* — Westerman, Hattori, Daniels & Adrian, LLP (57) ABSTRACT

The invention relates to a liquid nitrogen cooling sensor device container and liquid nitrogen cooling sensor equipment, and effectively reduces low-frequency noise while maintaining the ease with which a probe can be inserted in and removed from liquid nitrogen. Said invention comprises: a liquid nitrogen containing insulating container that contains liquid nitrogen; a sensor fixing member which has a distal end portion to which a sensor operating at a temperature of the liquid nitrogen is attached; and a fixing buffer member which is for fixing the sensor fixing member to the liquid nitrogen containing insulating container, (Continued)

wherein the fixing buffer member exerts a buffering effect in the liquid nitrogen.

14 Claims, 7 Drawing Sheets

(56) References Cited

U.S. PATENT DOCUMENTS

| | | | |
|---|---|---|---|
| 8,522,618 B1* | 9/2013 | Ratner | G01L 7/084 |
| | | | 600/487 |
| 2002/0024338 A1 | 2/2002 | Saho et al. | |
| 2002/0158630 A1 | 10/2002 | Itozaki et al. | |
| 2011/0204884 A1* | 8/2011 | Claeys | G01R 33/028 |
| | | | 324/244 |

FOREIGN PATENT DOCUMENTS

| | | |
|---|---|---|
| JP | 2-98980 A | 4/1990 |
| JP | 2002-76453 A | 3/2002 |
| JP | 2004-226161 A | 8/2003 |
| JP | 2008-145119 A | 6/2008 |
| JP | 2008-205401 A | 9/2008 |
| JP | 2009-47335 A | 3/2009 |
| JP | 2001-255358 A | 9/2009 |

OTHER PUBLICATIONS

International Search Report dated Feb. 5, 2013 issued in corresponding application No. PCT/JP2012/078654.
Extended European Search Report dated Jul. 10, 2015, issued in counterpart European Patent Application No. 12859584.0. (6 pages).

* cited by examiner

LIQUID NITROGEN COOLING SENSOR DEVICE CONTAINER AND LIQUID NITROGEN COOLING SENSOR DEVICE

TECHNICAL FIELD

The present invention relates to a liquid nitrogen cooling sensor device container and a liquid nitrogen cooling sensor equipment, and, for example, relates to a technique of reducing low frequency noise, produced by bubbles generated as the liquid nitrogen evaporates, for a sensor using a superconducting quantum interference device (SQUID), used in an underground resource exploration equipment and the like.

BACKGROUND ART

SQUIDs, using a high-temperature superconductor, are used in sensor devices such as an underground resource exploration equipment, a geomagnetic observation equipment, and a non-destructive testing device. Such a sensor device using the SQUID requires liquid nitrogen cooling and low noise conditions.

Conventionally, in the liquid nitrogen cooling process in a SQUID underground resource exploration equipment, geomagnetic observation equipment, non-destructive testing device, and the like, where metal blocks should not be adjacently positioned around a sensor in particular, most of the time, the sensor has been directly immersed in the liquid nitrogen by using a rod-shaped probe rod. Here, low frequency noise, due to vibration caused by bubbles generated as the liquid nitrogen evaporates, adversely affects the measurement accuracy. Thus, a technique for preventing the vibration is required.

In order to control the vibration, Cited Literature 1 introduces a method of performing a control to prevent the bubbles from being generated as the liquid nitrogen evaporates, by providing a rough surface member on an inner bottom surface portion of an insulating container and the like. However, with this conventional method, large bubbles are prevented from being generated, but relatively small bubbles are generated, and thus the low frequency noise due to the vibration of the sensor still remains. Thus, such vibration needs to be further prevented to achieve more accurate measurement.

Cited Literature 2 introduces a method of forming a concaved recess in a bottom portion of a container and fitting a rod, having a sensor attached to the distal end, in the recess. A material that solidifies in the liquid nitrogen may be provided in the fitting portion for fixing and thus further stabilizing the sensor.

However, this conventional method has a problem that the rod cannot be freely inserted and pulled out while the liquid nitrogen is contained, and thus the sensor replacement and liquid nitrogen refilling cannot be easily performed. Thus, to use the device in an outdoor measurement site, for underground resource exploration, geomagnetic observation, and the like, an improvement is required so that such operations can be easily performed.

CITATION LIST

Patent Literature

Patent Literature 1: Japanese Patent Application Laid-open No. 2008-145119

Patent Literature 2: Japanese Patent Application Laid-open No. 2009-047335

SUMMARY OF INVENTION

Problems to be Solved by the Invention

To effectively utilize the liquid nitrogen, the sensor needs to be disposed as close as possible to the container bottom surface. However, this causes a problem that the sensor is directly affected by the vibration of the probe caused by the bubbles generated as the liquid nitrogen evaporates.

As a result, the characteristic vibration of the probe makes the measurement result less accurate, in the underground resource exploration and the geomagnetic observation, in which the low frequency noise is required to be reduced. In particular, when the liquid nitrogen cooling process needs to be performed for a long period of time, the sensor needs to be attached to the distal end of a long probe rod, and thus even a slight vibration vibrates the probe rod to produce the measurement noise.

Thus, an object of the present invention is to absorb the vibration of the probe caused by external factors or by the bubbles generated as the liquid nitrogen evaporates, with a damper effect, to effectively prevent the vibration, and thus reduce the low frequency noise, while allowing the probe to be easily inserted into and pulled out from the liquid nitrogen.

Means for Solving the Problems

One disclosed aspect provides a liquid nitrogen cooling nitrogen sensor device container having: a liquid nitrogen containing insulating container which contains liquid nitrogen; a sensor fixing member which has a distal end portion to which a sensor operating at a temperature of the liquid nitrogen is attached; and a fixing buffer member which fixes the sensor fixing member to the liquid nitrogen containing insulating container. The fixing buffer member exerts a buffering effect in the liquid nitrogen.

Another disclosed aspect provides a liquid nitrogen cooling sensor equipment having: the liquid nitrogen cooling nitrogen sensor device container described above; and a sensor attached to a sensor attachment surface of the sensor fixing member.

Advantageous Effects of the Invention

With the liquid nitrogen cooling sensor device container and the liquid nitrogen cooling sensor equipment that are disclosed, low frequency noise is absorbed by the damper effect and thus can be effectively reduced, while a probe is able to be easily inserted into and pulled out from the liquid nitrogen. As a result, stable measurement for a long period of time can be achieved.

DESCRIPTION OF EMBODIMENTS

Figure 1:
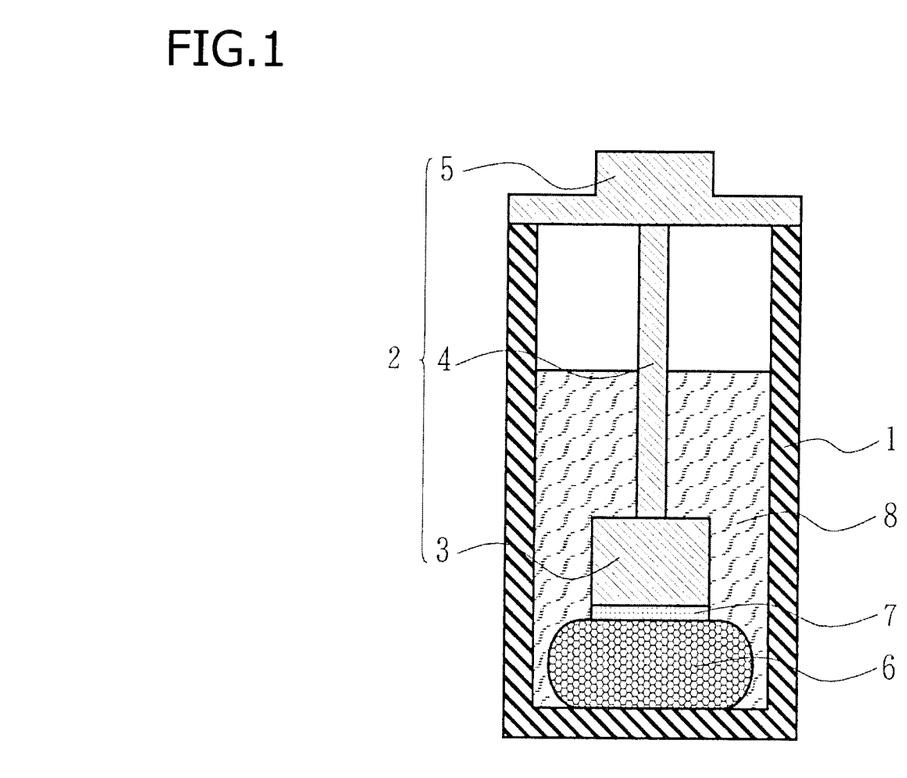
FIG. 1 is a schematic configuration cross-sectional view of a liquid nitrogen cooling sensor equipment of an embodiment of the present invention.

Now, a liquid nitrogen cooling sensor equipment of an embodiment of the present invention will be described by referring to FIG. 1. FIG. 1 is a schematic configuration cross-sectional view of the liquid nitrogen cooling sensor equipment of the embodiment of the present invention. The liquid nitrogen cooling sensor equipment includes: a liquid nitrogen containing insulating container 1; a sensor fixing member 2 including a sensor fixing unit 3, a probe rod 4, and a lid member 5; and a fixing buffer member 6. A sensor 7, such as a SQUID, is fixed on a surface of the sensor fixing unit 3 with a pin and the like, and is immersed in liquid nitrogen 8. A wire connected to the sensor 7 penetrates inside the probe rod 4, and thus an output from the sensor 7 is sent to the outside.

The liquid nitrogen containing insulating container 1 is made of a non-magnetic/non-conducting material such as glass or resin. Typically, the liquid nitrogen containing insulating container 1 is a glass dewar having a double tube structure, and is generally stored in an outer insulating container made of resin with a buffer disposed in between. The sensor fixing member 2 is made of a non-magnetic/non-conducting material such as plastic, and is tightly fixed to the outer insulating container, or when the outer insulating container is not used, to the liquid nitrogen containing insulating container 1, with a fitting/fixing mechanism, for rotation screwing and the like, provided on the lid member 5.

The fixing buffer member 6 is required to have a feature of having gaps through which a sufficient amount of liquid nitrogen 8 for cooling the sensor 7 passes, and having the function of flexibly supporting the sensor fixing member 2, which will not be impaired by bulging, shrinking, solidifying, or the like in the liquid nitrogen 8. As the fixing buffer member 6 having the feature, a polymer having repeating gaps, a non-conductive and non-magnetic spring such as a plastic spring, or a non-conductive and non-magnetic fiber material such as glass wool, is used. The fiber material may be in the form of a thread or fabric.

When the polymer, having the connecting gaps, is used, the polymer is preferably a melamine foam, a polyvinyl alcohol (PVA) sponge, UPIREX-FORM (registered trademark: UBE INDUSTRIES, LTD.), or the like. The disposed position of the fixing buffer member 6, formed of the polymer, is typically a position to be in contact with the bottom surface of the liquid nitrogen containing insulating container 1, but may alternatively be a position to be in contact with a side surface of the liquid nitrogen containing insulating container 1.

Alternatively, the fixing buffer member 6 may cover the sensor 7 and the fixing unit 3 as well as a part of the probe rod 4. Here, the fixing buffer member 6 may be vertically divided in two to incorporate the sensor 7, the sensor fixing unit 3, and the like.

Such a fixing buffer member 6 is inserted and pressed in the liquid nitrogen containing insulating container 1 containing the liquid nitrogen 8, while being adhered and fixed to the sensor 7 or the sensor fixing unit 3 with a double-sided tape and the like. Thus, the fixing buffer member 6 is compressed so that the sensor fixing member 2 is fixed. As a result, the sensor fixing member 2 has upper and lower sides fixed with an upper portion fixed by the fitting/fixing mechanism, and a lower end fixed by the fixing buffer member 6, and thus is less likely to be affected by the vibration caused by bubbles generated as the liquid nitrogen 8 evaporates.

The fixing buffer member 6 is not fixed to the liquid nitrogen containing insulating container 1. Thus, the sensor fixing member 2 can be easily inserted and pulled out, and the fixing buffer member 6 can be easily attached and detached, whereby the replacing of the sensor 7, refilling of the liquid nitrogen 8, and the like can be easily performed.

Embodiment 1

Figure 2:
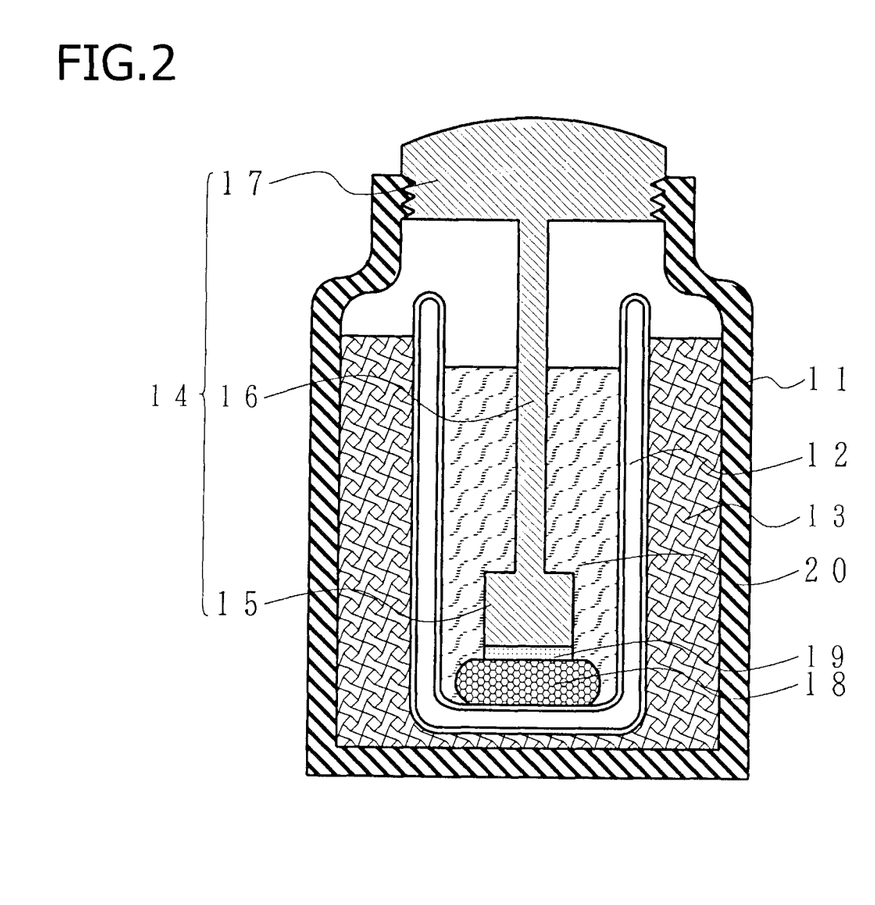
FIG. 2 is a schematic cross-sectional view of a liquid nitrogen cooling sensor equipment of Embodiment 1 of the present invention.

Next, the liquid nitrogen cooling sensor equipment of Embodiment 1 of the present invention will be described by referring to FIG. 2 and FIG. 3. FIG. 2 is a schematic cross-sectional view of the liquid nitrogen cooling sensor equipment of Embodiment 1 of the present invention. The liquid nitrogen cooling sensor equipment includes: an outer insulating container 11 made of plastic; a dewar 12 made of glass and having the double tube structure; a buffer 13 that protects/fixes the dewar 12; a probe 14 to be inserted in the dewar 12; and a fixing damper 18 that fixes the inserted probe 14 by the buffering effect.

The probe 14 is made of plastic, and includes: a sensor fixing unit 15 for fixing a superconducting sensor 19 with a pin; a probe rod 16; and a lid member 17. The wire of the superconducting sensor 19 is inserted through the probe rod 16 and the lid member 17. A lid screw is curved on a side circumference of the lid member 17, and is tightly coupled with a lid screw structure formed on an outer circumference of an upper portion of the outer insulating container 11, through the rotation screwing.

The fixing damper 18 is formed of the melamine foam as the polymer having connecting gaps, and is adhered on an attachment surface of the sensor fixing unit 15, on which the sensor 19 is attached, with a double-sided tape. The probe 14, on which the fixing damper 18 is adhered, is inserted in the dewar 12 containing liquid nitrogen 20. The fixing damper 18 is pressed against a bottom portion of the dewar 12 to be fixed thereto, by the rotation screwing by using the lid screw. Here, the melamine foam is sufficiently flexible at the temperature of the liquid nitrogen, and thus is compressed so that a bottom portion of the probe 14 is fixed.

Figure 3:
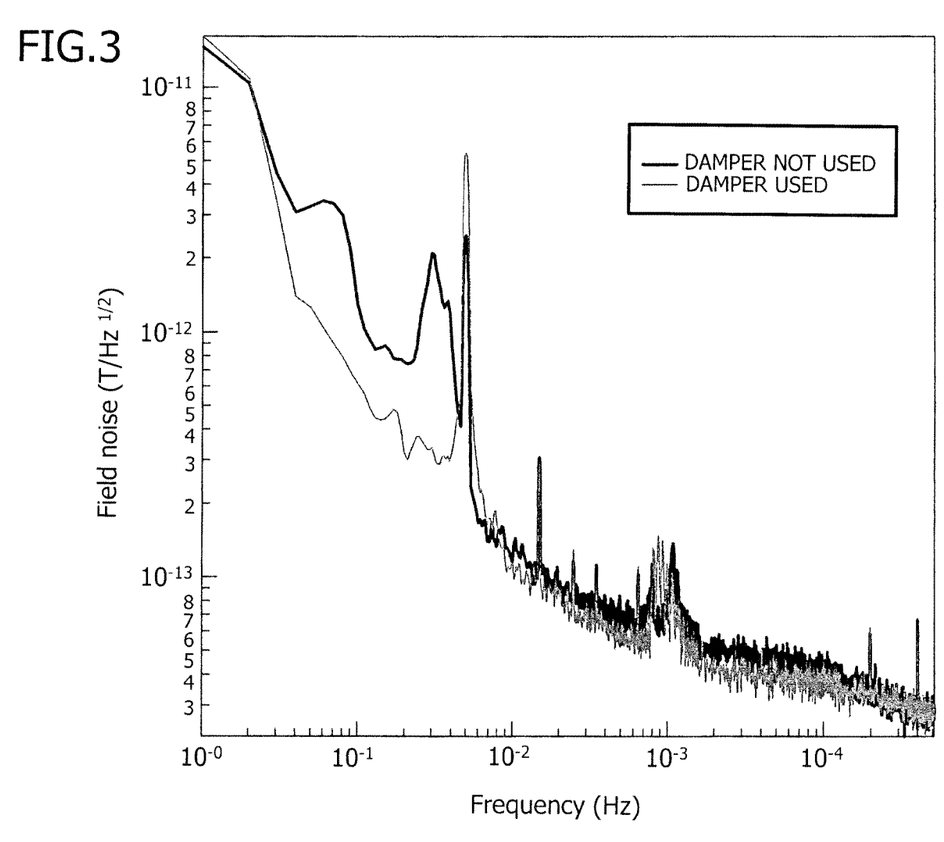
FIG. 3 is a diagram describing a damper effect of a melamine foam.

FIG. 3 is a diagram describing a damper effect of a melamine foam. This figure shows frequency dependence of noise in geophysical transient electromagnetics (TEM method), which is one of electromagnetic explorations used for the underground resource exploration.

In the TEM method, the low frequency noise is directly related to the degradation of the accuracy in deep exploration, and thus it is very important to reduce the low frequency noise. A specific frequency signal, superimposed by commercial electric power transmission, can be eliminated by stacking in data processing, but irregular noise caused by the vibration is difficult to eliminate.

As shown in FIG. 3, when the lower portion of the probe is not fixed by the melamine foam damper as in the conventional case, a noise peak of about 30 pT/Hz$^{1/2}$ is observed around 3 Hz to 40 Hz. It has been confirmed that, in Embodiment 1 of the present invention, the low frequency noise can be much more effectively eliminated with the lower portion fixed by the melamine foam.

Embodiment 2

Figure 4:
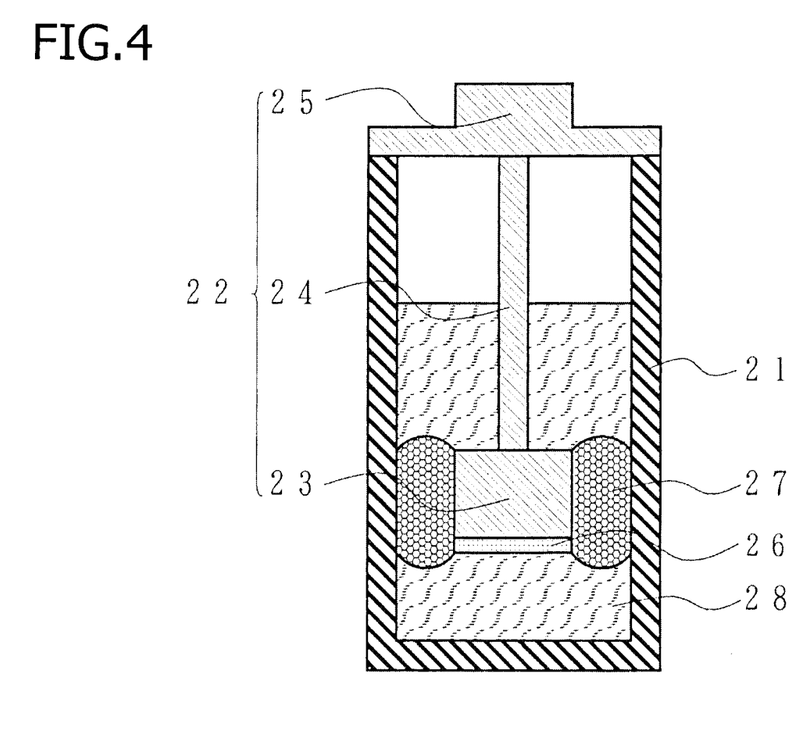
FIG. 4 is a schematic cross-sectional view of a liquid nitrogen cooling sensor equipment of Embodiment 2 of the present invention.

Next, a liquid nitrogen cooling sensor equipment of Embodiment 2 of the present invention will be described by referring to FIG. 4. FIG. 4 is a schematic cross-sectional view of the liquid nitrogen cooling sensor equipment of Embodiment 2 of the present invention. The liquid nitrogen cooling sensor equipment will be described as a single insulating container for simplifying the description, but generally has a double structure composed of the outer insulating container and the dewar.

In Embodiment 2 of the present invention, the PVA sponge is used as a fixing damper 27, and the fixing damper 27 is wrapped around a side surface of a sensor fixing unit 23 with a double-sided tape. Also in this case, the PVA sponge is sufficiently elastic at the temperature of the liquid nitrogen, and thus is compressed when a probe 22 is pressed into the liquid nitrogen containing insulating container 21, so that the sensor fixing unit 23 is fixed.

This structure is effective in a case where a superconducting sensor 26 has, at the distal end, complicated wires and the like, and no rigid structure. The fixing damper 27 does not come into direct contact with the superconducting sensor 26, and thus does not damage the superconducting sensor 26.

Embodiment 3

Figure 5:
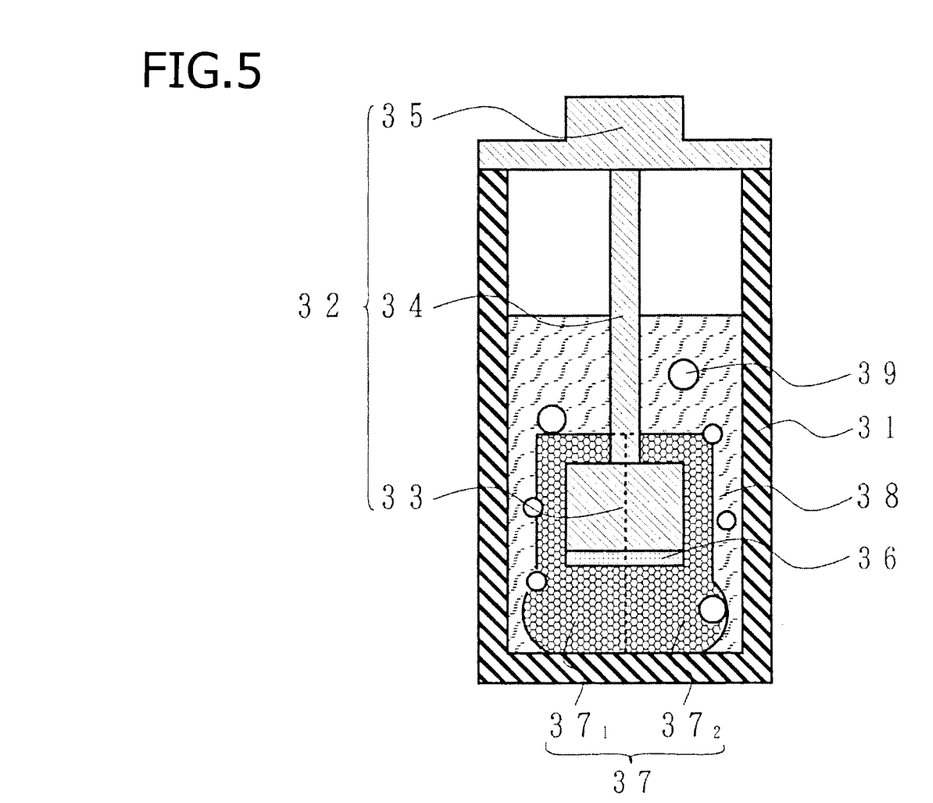
FIG. 5 is a schematic cross-sectional view of a liquid nitrogen cooling sensor equipment of Embodiment 3 of the present invention.

Next, a liquid nitrogen cooling sensor equipment of Embodiment 3 of the present invention will be described by referring to FIG. 5. FIG. 5 is a schematic cross-sectional view of the liquid nitrogen cooling sensor equipment of Embodiment 3 of the present invention. In this embodiment, a liquid nitrogen containing insulating container 31 is formed of Styrofoam.

In Embodiment 3 of the present invention, a fixing damper 37 is the UPIREX-FORM (registered trademark: UBE INDUSTRIES, LTD.) and covers a superconducting sensor 36 and a sensor fixing unit 33, as well as a part of a probe rod 34. In this embodiment, the fixing damper 37 includes two members 37$_1$ and 37$_2$ of a vertically divided structure. The superconducting sensor 36 and the sensor fixing unit 33 may be pressed into a recess portion formed in the members 37$_1$ and 37$_2$.

To form a large sensor equipment, a large liquid nitrogen containing insulating container 31 needs to be formed. It is difficult to form such a large liquid nitrogen containing insulating container 31 with glass. Thus, the insulating container is formed of resin or Styrofoam. However, when the resin or the Styrofoam is used, there is a problem that the bubbles are more likely to be produced as the liquid nitrogen 38 evaporates.

In Embodiment 3 of the present invention, the configuration of covering a probe 32, including a superconducting sensor 36, entirely is employed. Thus, the influence of the vibration caused by bubbles 39 produced in the liquid nitrogen containing insulating container 31 is prevented from being directly transmitted to the probe 32, and the low frequency noise can be reduced.

Embodiment 4

Figure 6:
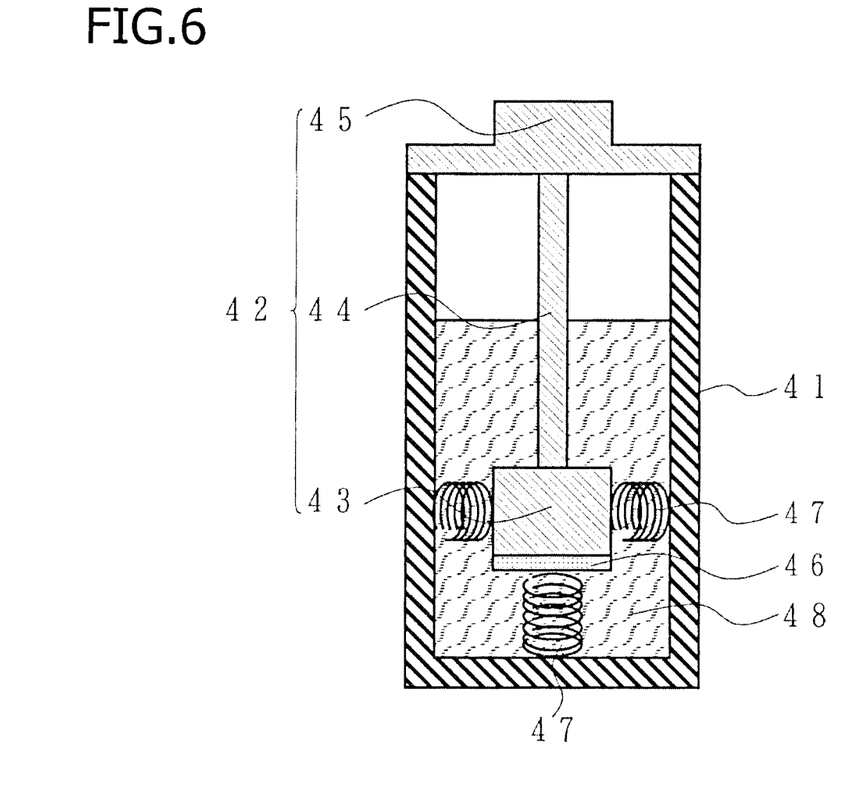
FIG. 6 is a schematic cross-sectional view of a liquid nitrogen cooling sensor equipment of Embodiment 4 of the present invention.

Next, a liquid nitrogen cooling sensor equipment of Embodiment 4 of the present invention will be described by referring to FIG. 6. FIG. 6 is a schematic cross-sectional view of the liquid nitrogen cooling sensor equipment of Embodiment 4 of the present invention. Also in this case, the liquid nitrogen cooling sensor equipment will be described as a single insulating container for simplifying the description, but generally has a double structure composed of the outer insulating container and the dewar.

In Embodiment 4 of the present invention, fixing dampers 47 are non-magnetic/non-conductive plastic springs, and are attached on a bottom surface of a superconducting sensor 46 and on a side circumference surface of a sensor fixing unit 43, with a double-sided tape. This plastic spring may be any spring that can reduce the vibration of a probe 42, such as a spring of which the vibration does not resonate with the characteristic frequency of the probe 42, and a numerical design for a damper is easy.

Embodiment 5

Figure 7:
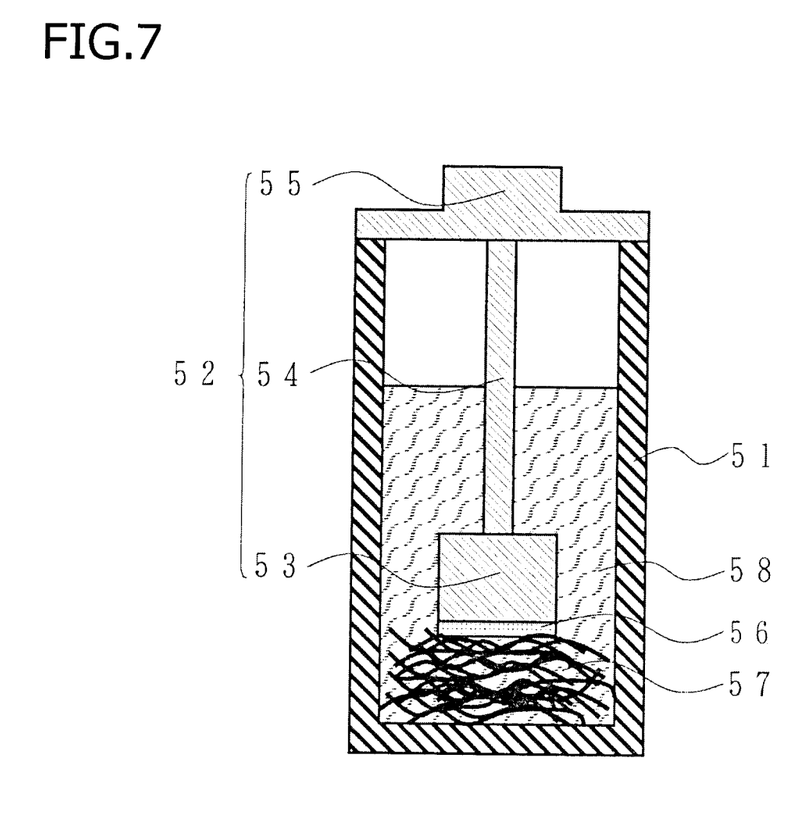
FIG. 7 is a schematic cross-sectional view of a liquid nitrogen cooling sensor equipment of Embodiment 5 of the present invention.

Next, a liquid nitrogen cooling sensor equipment of Embodiment 5 of the present invention will be described by referring to FIG. 7. FIG. 7 is a schematic cross-sectional view of the liquid nitrogen cooling sensor equipment of Embodiment 5 of the present invention. Also in this case, the liquid nitrogen cooling sensor equipment will be described as a single insulating container for simplifying the description, but generally has a double structure composed of the outer insulating container and the dewar.

In Embodiment 5 of the present invention, a fixing damper 57 is a wool made of glass fibers, which is a non-magnetic/non-conductive fiber material, and is laid on a bottom surface of a liquid nitrogen containing insulating container 51 to have a height, at which a sufficient elasticity for fixing a probe 52 can be obtained.

In Embodiment 5 of the present invention, the wool made of glass fibers is simply laid, and thus the probe can be quite easily inserted and pulled out, for replacing a sensor or refilling the liquid nitrogen.

The above description of the embodiments are based on the TEM method, where not only magnetic charge, but also conductivity, needs to be avoided, and thus the non-magnetic and non-conductive materials are used as the fixing damper. Thus, a conductive member may be used in a case of a measurement method where the conductivity needs not to be avoided.

The above-described embodiments, which are described as the sensor equipment, also refer to the liquid nitrogen cooling sensor device container for a superconducting sensor without the superconducting sensor, because the superconducting sensor is appropriately replaced in actual use.

The embodiments described above, which are described based on the double structure composed of the outer insulating container and the liquid nitrogen containing insulating container, may also be applied to a case of a single liquid nitrogen containing insulating container only.

REFERENCE SIGNS LIST 1 liquid nitrogen containing insulating container
2 sensor fixing member 3 sensor fixing unit
4 probe rod
5 lid member
6 fixing buffer member
7 sensor
8 liquid nitrogen
11 outer insulating container
12 dewar
13 buffer
14 probe
15 sensor fixing unit
16 probe rod
17 lid member
18 fixing damper
19 superconducting sensor
20 liquid nitrogen
21, 31, 41, 51 liquid nitrogen containing insulating container
22, 32, 42, 52 probe
23, 33, 43, 53 sensor fixing unit
24, 34, 44, 54 probe rod
25, 35, 45, 55 lid member
26, 36, 46, 56 superconducting sensor
27, 37, 47, 57 fixing damper
28, 38, 48, 58 liquid nitrogen
$37_1$, $37_2$ member
39 bubble

The invention claimed is:

1. A liquid nitrogen cooling nitrogen sensor device container comprising:
   a liquid nitrogen containing insulating container which contains liquid nitrogen;
   a sensor fixing member which has a distal end portion to which a sensor operating at a temperature of the liquid nitrogen is attached; and
   a fixing buffer member configured to be compressed to fix the sensor fixing member to the liquid nitrogen containing insulating container, wherein
   the fixing buffer member absorbs vibration of the sensor fixing member caused by external factors or by bubbles generated as the liquid nitrogen evaporates, and
   wherein the fixing buffer member is configured to be selectively detached and attached to the nitrogen containing insulating container.

2. The liquid nitrogen cooling nitrogen sensor device container according to claim 1, wherein the fixing buffer member is disposed to be in contact with at least a bottom surface of the liquid nitrogen containing insulating container.

3. The liquid nitrogen cooling nitrogen sensor device container according to claim 1, wherein the fixing buffer member is disposed to be in contact with at least a side surface of the liquid nitrogen containing insulating container.

4. The liquid nitrogen cooling nitrogen sensor device container according to claim 1, wherein the fixing buffer member is disposed to be in contact with at least a bottom surface of the liquid nitrogen containing insulating container, and also covers at least a side surface of the sensor fixing member.

5. The liquid nitrogen cooling nitrogen sensor device container according to claim 1, wherein the fixing buffer member is formed from a polymer having continuous voids.

6. The liquid nitrogen cooling nitrogen sensor device container according to claim 1, wherein the fixing buffer member is a non-magnetic spring.

7. The liquid nitrogen cooling nitrogen sensor device container according to claim 1, wherein the fixing buffer member is a non-magnetic fiber material.

8. A liquid nitrogen cooling sensor equipment comprising:
   the liquid nitrogen cooling nitrogen sensor device container according to claim 1; and
   a sensor attached to a sensor attachment surface of the sensor fixing member.

9. The liquid nitrogen cooling nitrogen sensor device container according to claim 2, wherein the fixing buffer member is formed from a polymer having continuous voids.

10. The liquid nitrogen cooling nitrogen sensor device container according to claim 3, wherein the fixing buffer member is formed from a polymer having continuous voids.

11. The liquid nitrogen cooling nitrogen sensor device container according to claim 4, wherein the fixing buffer member is formed from a polymer having continuous voids.

12. A liquid nitrogen cooling sensor equipment comprising:
   the liquid nitrogen cooling nitrogen sensor device container according to claim 2; and
   a sensor attached to a sensor attachment surface of the sensor fixing member.

13. A liquid nitrogen cooling sensor equipment comprising:
   the liquid nitrogen cooling nitrogen sensor device container according to claim 3; and
   a sensor attached to a sensor attachment surface of the sensor fixing member.

14. A liquid nitrogen cooling sensor equipment comprising:
   the liquid nitrogen cooling nitrogen sensor device container according to claim 4; and
   a sensor attached to a sensor attachment surface of the sensor fixing member.

* * * * *